(12) United States Patent
Sasaura et al.

(10) Patent No.: US 8,992,683 B2
(45) Date of Patent: Mar. 31, 2015

(54) APPARATUS FOR PRODUCING CRYSTALS

(75) Inventors: Masahiro Sasaura, Atsugi (JP); Hiroki Kohda, Hiratsuka (JP); Kazuo Fujiura, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 1812 days.

(21) Appl. No.: 10/589,719

(22) PCT Filed: Nov. 16, 2005

(86) PCT No.: PCT/JP2005/021055
§ 371 (c)(1),
(2), (4) Date: Jan. 4, 2007

(87) PCT Pub. No.: WO2006/054610
PCT Pub. Date: May 26, 2006

(65) Prior Publication Data
US 2007/0209579 A1     Sep. 13, 2007

(30) Foreign Application Priority Data
Nov. 16, 2004 (JP) .................................. 2004-332067

(51) Int. Cl.
*C30B 35/00* (2006.01)
*C30B 11/00* (2006.01)
*C30B 29/30* (2006.01)
*C30B 29/32* (2006.01)

(52) U.S. Cl.
CPC ............... *C30B 29/30* (2013.01); *C30B 11/002* (2013.01); *C30B 11/003* (2013.01); *C30B 29/32* (2013.01)
USPC ............................ 117/217; 117/200; 117/222

(58) Field of Classification Search
USPC .................................. 117/200, 217, 218, 222
See application file for complete search history.

(56) References Cited

U.S. PATENT DOCUMENTS 3,857,436 A * 12/1974 Petrov et al. ................ 164/122.2
3,898,051 A *  8/1975 Schmid ............................ 117/83
(Continued)

FOREIGN PATENT DOCUMENTS

| JP | 57-095889 | 6/1982 |
|---|---|---|
| JP | 59-107996 | 6/1984 |
| JP | 05-024965 | 2/1993 |
| JP | 05-194073 | 8/1993 |
| JP | 06-247787 | 9/1994 |

OTHER PUBLICATIONS

Supplementary European Search Report from related European Application No. EP 05806692, dated Mar. 24, 2009 (6 pages).
(Continued)

*Primary Examiner* — Matthew Song
(74) *Attorney, Agent, or Firm* — Workman Nydegger (57) ABSTRACT

Highly-qualified crystals are grown with good yield under an optimal temperature condition by controlling the axial temperature distribution in the vicinity of the seed crystal locally. In an apparatus for producing crystals to grow crystals wherein a seed crystal 14 is placed in a crucible 11 which is retained in a furnace, raw materials 12 filled in the crucible 11 are heated and liquefied, and a raw material 12 slowly cooled in the crucible 11 from below upward, the apparatus including a temperature controller for controlling temperature to cool or heat the vicinity of the seed crystal 14 locally. The temperature controller controls the temperature by a hollow constructed cap 17 mounted outside the portion of crucible 11 and regulates refrigerant flow running through the hollow portion.

18 Claims, 10 Drawing Sheets

(56) References Cited

U.S. PATENT DOCUMENTS

| | | | |
|---|---|---|---|
| 4,015,657 A | | 4/1977 | Petrov et al. |
| 4,049,384 A | * | 9/1977 | Wenckus et al. ............ 117/203 |
| 4,404,172 A | | 9/1983 | Gault |
| 4,521,272 A | | 6/1985 | Gault |
| 5,342,475 A | | 8/1994 | Yoshida et al. |
| 5,567,399 A | * | 10/1996 | Von Ammon et al. ..... 422/245.1 |
| 6,117,402 A | * | 9/2000 | Kotooka et al. ............ 422/245.1 |
| 6,740,160 B2 | * | 5/2004 | Kubo et al. .................. 117/217 |
| 6,942,733 B2 | * | 9/2005 | Cherko et al. ............... 117/208 |
| 2003/0084839 A1 | * | 5/2003 | Hemley et al. ............... 117/201 |
| 2004/0261691 A1 | * | 12/2004 | Doguchi ....................... 117/83 |

OTHER PUBLICATIONS

Chen, H et al, *Growth of LiNb-3 crystals by the Bridgman method*, Journal of Crystal Growth, Elsevier, Amsterdam, NH, vol. 256 (2003), pp. 219.222.

Office Action issued on Apr. 17, 2012 in Japanese Application No. 2009-125875.

Office Action issued on Apr. 17, 2012 in Japanese Application No. 2009-125874.

\* cited by examiner

APPARATUS FOR PRODUCING CRYSTALS

TECHNICAL FIELD

The present invention relates to an apparatus for producing crystals, and more particularly relates to an apparatus for growing highly-qualified crystals with good yield by a Vertical Bridgman Method and a Vertical Gradient Freeze Method.

BACKGROUND ART

Conventionally, as a method for producing crystalline oxide materials, (1) a Horizontal Bridgman Method in which a temperature gradient is given horizontally to a growth chamber and liquefied materials in the growth chamber is solidified from a low-temperature seed crystal, (2) a Vertical Bridgman Method in which a temperature gradient is given vertically to a growth chamber, and liquefied materials in the growth chamber is solidified from a low-temperature seed crystal by moving the growth chamber, (3) a Vertical Gradient Freeze Method in which a temperature gradient is changed by fixing a growth chamber vertically and liquefied materials in the growth chamber solidified crystals from a low-temperature seed crystal (e.g., See Patent Document 1), have been known.

Figure 1:
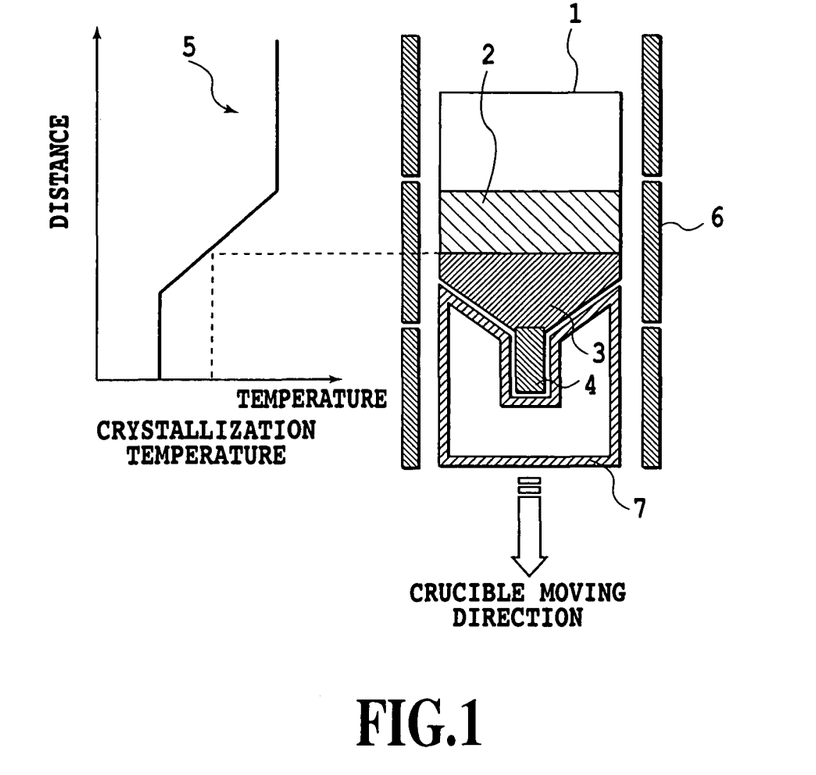
FIG. 1 is a view illustrating a method for producing crystals by a conventional Vertical Bridgman Method.

With reference to FIG. 1, the method for producing the crystals by the conventional Vertical Bridgman Method will be described. A seed crystal 4 and a raw material 2 are placed in a crucible 1. A raw material 2 is made into a liquefied raw material 2 by heating and liquefying with a heating element 6. Heating amount of the heating element 6 is regulated to retain crystal-producing furnace in an axial temperature distribution 5. The liquefied raw material 2 is cooled by moving the crucible 1 placed on a crucible support member 7 to a low temperature side. Then, the liquefied raw material 2 which have reached the crystallization temperature is grown to a crystal having the same crystal orientation as the seed crystal 4 and becomes a grown crystal 3.

The grown crystal 3 is then grown using the seed crystal 4 as nuclei, so that it can be grown as the grown crystal 3 having the same crystal orientation as the seed crystal 4.

Since an early phase of the crystallinity is transmitted to later stage of growth of the grown crystal 3, crystals grown in process of seeding is necessary to be maintained in high quality. The crystallinity depends on the state of an interface (solid-liquid interface) of the seed crystal 4 and the liquefied raw material 2 in the seeding process. Therefore, if temperature gradient in the vicinity of the crystallization temperature has a steep slope, the crystal rapidly grows. Then crystal structure and orientation cannot be inherited smoothly, and single-crystalline growth becomes difficult. Thermal stress due to a temperature variation is applied to the grown crystal 3 and a crystal lattice on solid-liquid interface distorts. A new crystal which reduces the distortion is grown at the solid-liquid interface and defects are increased in the crystal.

In the Vertical Bridgman Method, however, the temperature gradient in the vicinity of the solid-liquid interface is necessary so as to control the position of the solid-liquid interface. In order to grow single-crystalline crystal, crystal is produced by setting the temperature gradient necessary at the solid-liquid interface between the maximum temperature gradient that can maintain experimentally desired crystallinity and the minimum temperature gradient that can control the position of solid-liquid interface. This temperature gradient is reported as 8° C./cm at a constant diameter portion in the case of InP crystal (e.g., See Patent Document 2). In the conventional method, the temperature gradient in the vicinity of the solid-liquid interface is determined by the predetermined temperature of the heating element 4 for liquefying raw materials and the position of the crucible 1, while an accurate temperature regulation such as a local change in axial temperature distribution cannot be performed.

In the Vertical Bridgman Method, the solid-liquid interface in contact with a crucible wall generates stray crystals at the crucible wall. These stray crystals induce polycrystallization and cause degradation in crystallinity. In order to prevent this problem, temperature of solid-liquid interface of the crucible center can be lowered than temperature of the solid-liquid interface of the crucible wall, and the crystal growth at the solid-liquid interface can be progressed from center to wall of the crucible. In other words, the solid-liquid interface matched to an isothermal surface may be convexly formed toward the upper portion of the crucible. The convexly-formed solid-liquid interface can be achieved by removing heat selectively from the seed crystal 4.

The vicinity of the seed crystal 4 in the crucible 1 has a smaller capacity than the constant diameter portion and is affected by heat environment to increase in temperature variation. There is a concern that exceedingly high temperature may liquefy the seed crystal. Meanwhile, low temperature or precipitous temperature gradient may cause polycrystallization and crystal defect due to thermal stress.

The main object of the heat element used in the conventional method is to liquefy the raw material and to control the temperature gradient in the growing process at the constant diameter portion. However, there has been a problem that an accurate temperature gradient in the vicinity of the seed crystal in the seeding process cannot be controlled. According to the Patent Document 2, the temperature gradient in the vicinity of the seed crystal is reported as 60° C./cm in the case of InP crystal. This temperature gradient in the vicinity of the seed crystal controls the temperature gradient with the position of crucible and heat element for liquefying the raw material. Thus, the temperature gradient is used to avoid liquefying of the seed crystal in the case of temperature misalignment due to accuracy of placing crucible and temperature control of the heat element. However, in order to improve the crystallinity, as mentioned above, the growth of the seed crystal portion is also desired at the temperature gradient of 8° C./cm as used in the constant diameter portion.

For example, there may be a case that a raw material composition and a crystal composition differ each other and a crystal is grown from solution, such as K(Ta,Nb)O$_3$ crystal. In this case, a crystal is grown after a raw material liquefied at sufficiently high temperature as 100° C. higher than the crystallization temperature in order to thoroughly decompose the raw material by giving soaking treatment. When crystal is grown without giving soaking treatment, deterioration of crystallinity and polycrystallization may occur. Therefore, in order to improve a process yield, it is necessary to give soaking treatment of the liquefied raw material before the growth. In the conventional method, however, the temperature gradient realizable in the vicinity of the seed crystal is 70° C./cm at a maximum and there has been a problem that realizing soaking temperature directly above the seed crystal exceeds the crystallization temperature of the seed crystal so that the seed crystal is dissolved.

A method to use a heat sink is known as a method to make precipitous temperature gradient in the vicinity of the seed crystal (e.g., See Patent Document 3). Primary object of the heat sink is to form the solid-liquid interface convexly toward the upper portion of the crucible in order to prevent polycrystallization due to a generation of stray crystals at the crucible wall. A carbon with high thermal conductivity is used in the heat sink to produce a crucible support member with larger diameter than a crucible diameter. The seed crystal is cooled by running a cooling pipe through the crucible support member. A method of using the heat sink provides a thermal insulation between the heat sink and the crucible so as to avoid excessive heat removal from the crucible to the heat sink in contact with the crucible. The precipitous temperature gradient in the vicinity of the seed crystal may be provided by cooling the seed crystal by means of the heat sink.

However, capacity of heat removal from the seed crystal is low due to the heat removal from the crucible support member with high heat capacity, and the temperature gradient in the vicinity of the seed crystal only up to 200° C./cm may be achieved. Refrigerant flow to run through the cooling pipe is increased in order to provide precipitous temperature gradient in the vicinity of the seed crystal. Then, the liquefied raw material may also be cooled through the thermal insulation and the seed crystal cannot be cooled locally. Therefore, there has been a problem that the misalignment in temperature due to accuracy of placing crucible and temperature control accuracy of the heat element cannot be reduced. There has been another problem such as cracks in the seed crystal due to exceeding temperature variation in a vertical direction of the seed crystal.

Patent Document 1: Japanese Patent Application Laying-Open No. 59-107996

Patent Document 2: U.S. Pat. No. 4,404,172 Specification, FIG. 3

Patent Document 3: U.S. Pat. No. 5,342,475 Specification

DISCLOSURE OF THE INVENTION

An object of the present invention is to provide an apparatus for growing crystals or highly-qualified crystals with good yield under an optimal temperature condition by controlling the axial temperature distribution in the vicinity of the seed crystal locally.

In order to accomplish such an object, a temperature controlling means is provided for cooling or heating in the vicinity of the seed crystal locally in an apparatus for producing crystals, wherein the seed crystal is placed in the crucible retained in a furnace, raw materials filled in the crucible are heated and liquefied, and a crystal grown by slow cooling of raw materials in the crucible from below upward.

The temperature controlling means may include a hollow constructed cap mounted outside the crucible where the seed crystal is placed and means for regulating refrigerant flow running through the hollow portion. The temperature controlling means may also include a helical pipe mounted outside the crucible where the seed crystal is placed and means for regulating refrigerant flow running through the pipe.

BEST MODES FOR CARRYING OUT THE INVENTION

Embodiments of the present invention will be described in detail with reference to the drawings. The present embodiments performs a temperature control for locally cooling or heating the seed crystal in the crucible in addition to the temperature control performed by heating elements. These temperature controls achieve an optimal temperature distribution on the solid-liquid interface of the seed crystal and a raw material solution to grow highly-qualified crystal easily.

Figure 2A:
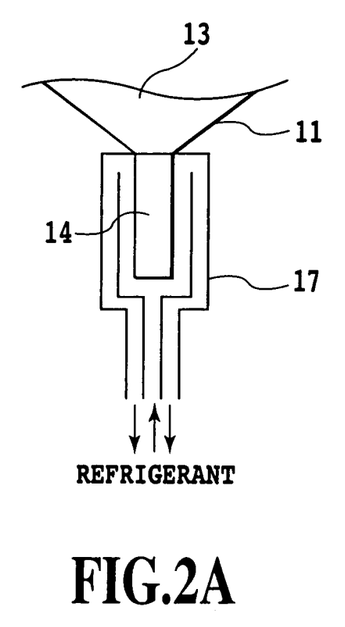
FIG. 2A is a view illustrating a cooling method of the seed crystal according to first embodiment of the present invention.
Figure 2B:
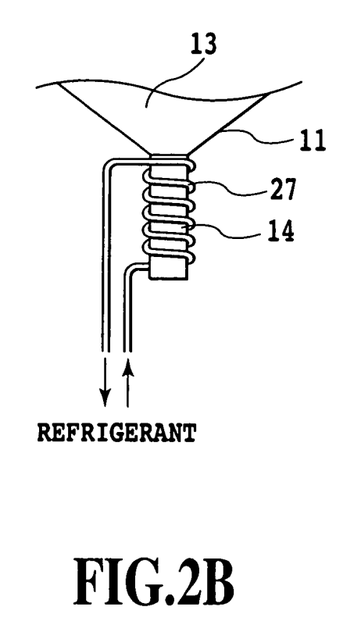
FIG. 2B is a view illustrating a cooling method of the seed crystal according to first embodiment of the present invention.

The method of the temperature control for locally cooling or heating the seed crystal will be described. In FIGS. 2A and 2B, a cooling method of the seed crystal according to Example 1 of the present invention is shown. In FIG. 2A, a cap type cooling apparatus is shown. A hollow double layered cap 17 is mounted outside the portion of the crucible 11 where the seed crystal 14 is placed. In FIG. 2B, a pipe type cooling apparatus is shown. A hollow pipe 27 is coiled around outside the portion of crucible 11 where the seed crystal 14 is placed. A local temperature distribution in the vicinity of the seed crystal 14 is controlled at an appropriate distribution for growing crystals by running refrigerant through the cap 17 and the pipe 27. The cap 17 and the pipe 27 are mounted directly outside the portion of crucible 11 where the seed crystal 14 is placed in order to obtain a rapid response to the temperature control as well as to regulate the local temperature distribution of the seed crystal 14. Temperature control is performed by refrigerant flow control such as water and gas. The refrigerant may be performed by temperature control through a radiator. The refrigerant running through the cap 17 or the pipe 27 is introduced from lower portion of the seed crystal and discharged to the upper portion depending on the temperature gradient. Consequently, the lower portion of the seed crystal may be cooled more than the upper portion, and vice versa.

The material of the cap 17 or the pipe 27 is a metal having conductive property, heat-resistant and corrosion-resistant of Pt or the equivalent, or an oxide having conductive property, heat-resistant and corrosion-resistant. The cap 17 or the pipe 27 ensures the equivalent durability with the crucible in the crystal growth environment.

Figure 3A:
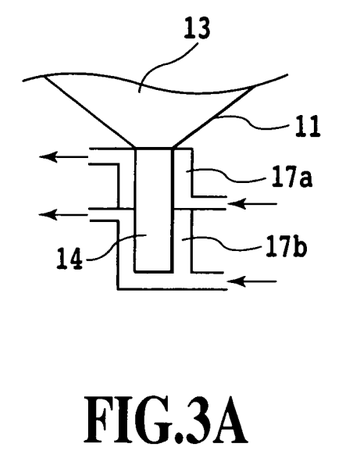
FIG. 3A is a view illustrating a cooling method of the seed crystal according to second embodiment of the present invention.
Figure 3B:
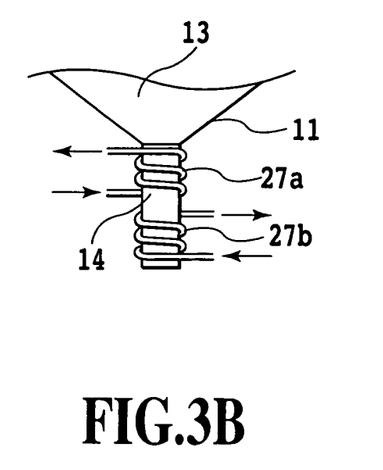
FIG. 3B is a view illustrating a cooling method of the seed crystal according to second embodiment of the present invention.

In FIGS. 3A and 3B, the cooling method of the seed crystal according to Example 2 of the present invention are shown. For example, the cap 17 or the pipe 27 is divided vertically into two stages and the refrigerant is flowed through each of the divided cap 17a, 17b or pipe 27a, 27b independently. Local temperature distribution in the vicinity of the seed crystal 14 can be controlled at an appropriate distribution for growing crystals in detail by dividing the cap 17 or the pipe 27 in multiple.

Figure 4A:
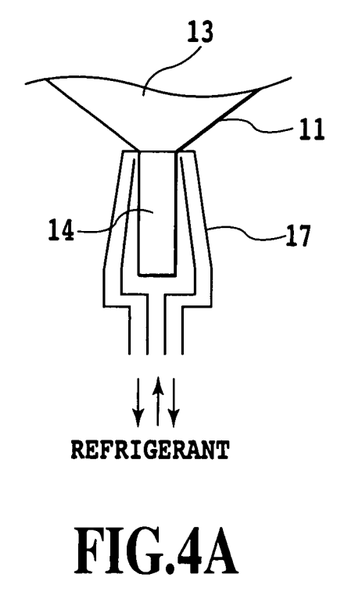
FIG. 4A is a view illustrating a cooling method of the seed crystal according to third embodiment of the present invention.
Figure 4B:
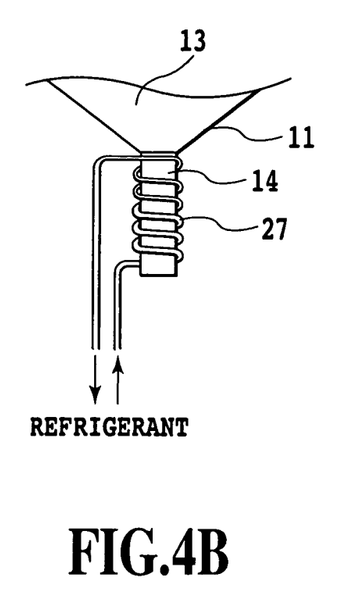
FIG. 4B is a view illustrating a cooling method of the seed crystal according to third embodiment of the present invention.

In FIGS. 4A and 4B, the cooling method of the seed crystal according to Example 3 of the present invention are shown. Cross section of the cap 17 or the pipe 27 varies in size along path direction of refrigerant flow. Thus, the refrigerant flow which contributes to heat removal is changed depending on the local portion in the vicinity of the seed crystal 14. Local temperature distribution in the vicinity of the seed crystal 14 can be controlled at an appropriate distribution for growing crystals in detail by regulating the refrigerant flow rate.

Figure 5A:
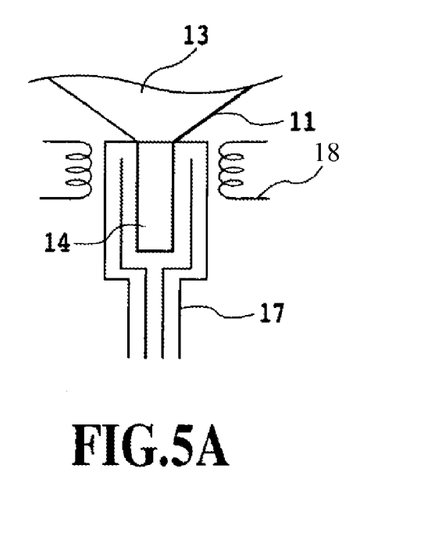
FIG. 5A is a view illustrating a cooling method of the seed crystal according to fourth embodiment of the present invention.
Figure 5B:
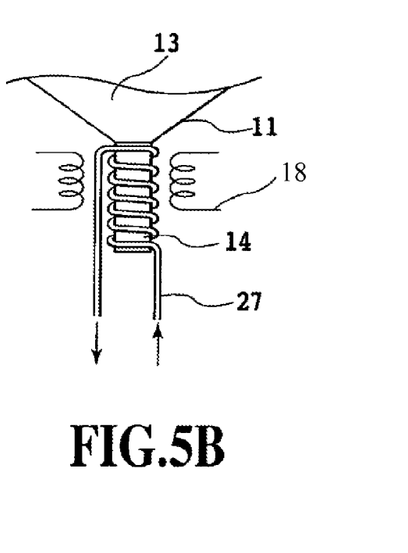
FIG. 5B is a view illustrating a cooling method of the seed crystal according to fourth embodiment of the present invention.

In FIGS. 5A and 5B, the cooling method of the seed crystal according to Example 4 of the present invention are shown. In addition to the cap 17 or the pipe 27 of the first embodiment shown in FIG. 2, resistance heating or high-frequency micro heater 18 is placed outside the portion of crucible 11 where the seed crystal 14 is placed. Cooling by the cap 17 or the pipe 27 and heating by the micro heater 18 enables the local temperature distribution in the vicinity of the seed crystal 14 to be controlled in detail. When material of the pipe 27 is metal, the pipe may be used as a heater which allows conduction directly and the temperature control may be performed by both cooling and heating. A temperature-measuring element is placed outside the portion of crucible 11 where the seed crystal 14 is placed, and the temperature of the seed crystal 14 is constantly measured during growing crystals. In this case, the seed crystal temperature may be controlled by refrigerant flow rate and heating amount of the micro heater 18.

Soaking treatment of 100° C. higher than the crystallization temperature is necessary for growing crystals from solution. Temperature gradient of local temperature distribution in the vicinity of the seed crystal 14 may be steepened by increasing the refrigerant flow rate, at this time. Experimentally, the temperature gradient of 600° C./cm and ten times the conventional amount may be achieved. This precipitous temperature gradient may realize an insoluble state with the temperature of seed crystal 14 under the crystallization temperature even when the soaking treatment is given. In addition, the temperature in the vicinity of the seed crystal 14 is not controlled by both the position of the crucible 11 and the heating element 16 for liquefying raw materials but controlled by the refrigerant flowed cap 17 or pipe 27 placed in the vicinity of the seed crystal 14 and the micro heater 18. Therefore, the accuracy of placing for each produced crucible 11 position and misalignment in temperature caused by accuracy of the temperature control of the heat element 16 may be corrected.

The major components produced in the present embodiments are composed of oxide or carbonate of Ia and Vb groups in a periodic table, the element of Ia group may be lithium and potassium, and the element of Vb group may beat least one of niobium and tantalum. Alternatively, the major components are composed of oxide or carbonate of Ia and Vb groups in a periodic table, the element of Ia group may be lithium and potassium, the element of Vb group may be at least one of niobium and tantalum, and may be at least one of oxide or carbonate of IIa group in a periodic table as added impurities.

Embodiments of the present invention will be described specifically. As a matter of course, the present embodiments are exemplifications, and various changes and improvements can be given without departing from the scope of the invention.

Example 1

Figure 6:
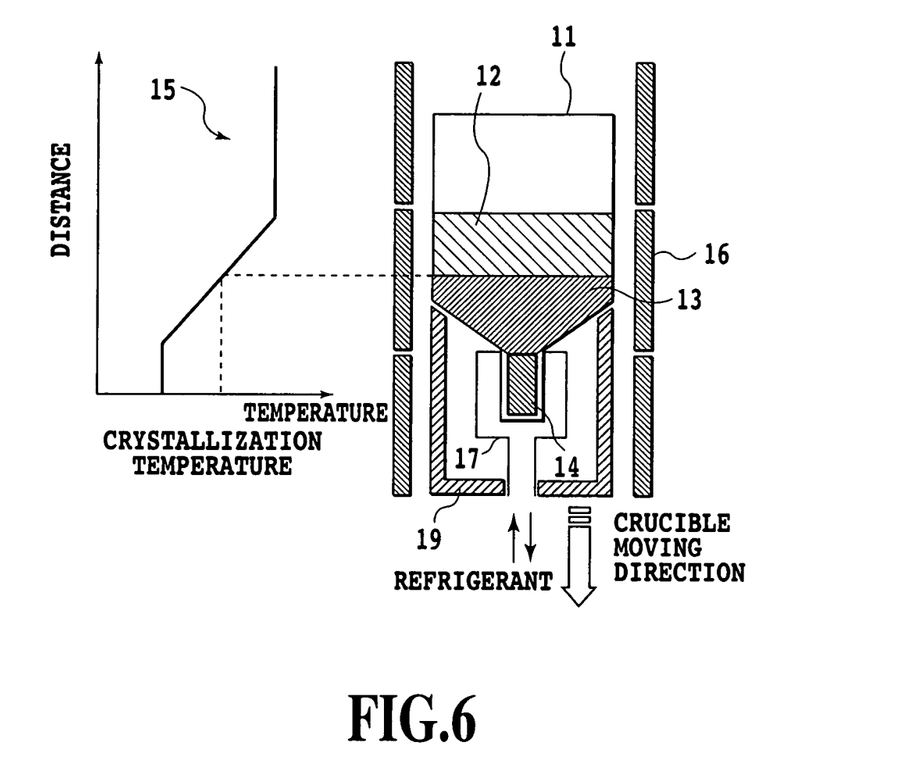
FIG. 6 is a view showing a configuration of an apparatus for producing crystals by the Vertical Bridgman Method according to Example 1 of the present invention.

In FIG. 6, a configuration of an apparatus for growing crystals by the Vertical Bridgman Method according to Example 1 of the present invention is shown. The case of producing $KTa_xNb_{1-x}O_3$ ($0 \leq x \leq 1$) crystals will be described. $K(Ta, Nb)O_3$ seed crystal 14 in direction of {100} is placed in a crucible 11 with a diameter of 2 inches. However, when the composition of $K(Ta, Nb)O_3$ seed crystal 14 is $KTa_{x'}Nb_{1-x'}O_3$, x' is larger than x of growing $KTa_xNb_{1-x}O_3$ and composition with high liquefying temperature is selected. The raw material of $KTa_xNb_{1-x}O_3$ is weighed to have natural raw material of $K_2CO_3$, $Ta_2O_5$, and $Nb_2O_5$ in a desired relative proportion and the total of 1 kg is filled in the crucible 11.

The temperature of the crucible 11 filled with $K(Ta, Nb)O_3$ seed crystal 14 and a raw material 12 are raised by the heating element 16 and made into a $K(Ta, Nb)O_3$ raw material solution 12 by heating and dissolving the raw material 12. The cap 17 which is the cooling apparatus as shown in FIG. 2A is mounted directly outside the portion of crucible 11 where the seed crystal 14 is placed, and placed on a crucible support member 19. Water as a refrigerant is flowed through the hollow portion of the cap 17 and the flow is regulated to control axial temperature distribution in the vicinity of the seed crystal 14 locally.

Soaking treatment is given for ten hours at a temperature of 100° C. higher than the crystallization temperature of $KTa_xNb_{1-x}O_3$. Water as a refrigerant is flowed through the cap 17 at this time. The flow rate is previously obtained experimentally and made to achieve a temperature gradient of 400° C./cm in the vicinity of the seed crystal 14. Subsequently, the heat rate of the heating element 16 is lowered and an axial temperature distribution 15 as shown in FIG. 6 is realized. At the same time, amount of the water as a refrigerant flowing through the cap 17 is reduced to the amount that temperature gradient 5° C./cm previously obtained experimentally to grow crystals is realizable on the solid-liquid interface in the vicinity of the seed crystal 14.

Figure 7:
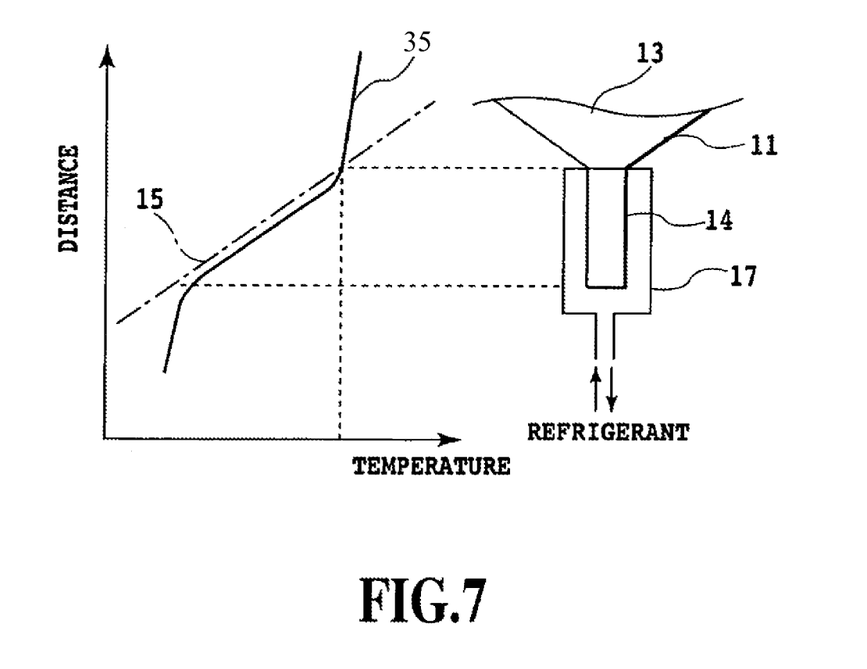
FIG. 7 is a view showing an example of the axial temperature distribution in the vicinity of the seed crystal according to Example 1.

In FIG. 7, an example of axial temperature distribution in the vicinity of the seed crystal is shown. Conventionally achieved axial temperature distribution is the axial temperature distribution 15. As shown in an axial temperature distribution 35, the portion where the seed crystal 14 is placed is locally cooled to make only the temperature gradient in the vicinity of the seed crystal 14 to 50° C./cm and the other furnace a temperature gradient is made to 5° C./cm. As a result, the seeding process is performed under an optimal temperature condition for crystal growth on the solid-liquid interface by retaining only the temperature gradient of the seed crystal 14 the same as that of the conventional temperature distribution 15.

Then, the crucible 11 is pulled down at a rate of 2 mm/day. $K(Ta, Nb)O_3$ raw material solution 12 is crystallized from lower portion of the crucible 11 by using $K(Ta, Nb)O_3$ seed crystal 14 as a nuclei and crystal 13 is grown. After the crystal growth, power of the heating element 16 is regulated to slowly cool down to room temperature.

When the produced K(Ta, Nb)O$_3$ crystal 13 is retrieved, four-fold {100}-faceted surface is expressed. There are no stray crystals generated from the crucible wall. Conventionally, seed crystals are dissolved by performing soaking treatment. According to Example 1, seed crystals are not dissolved. Cracks and defects are not found in the grown crystal and highly-qualified crystals may be grown with good yield. In addition, highly-qualified crystals may be also obtained with good yield in the case of using KTaO$_3$ seed crystal as a seed crystal.

KTa$_x$Nb$_{1-x}$O$_3$(0≤x≤1) crystal is produced by using the heat sink according to the Patent Document 3 for comparison. As mentioned above, a cooling efficiency is not sufficient because the distance between the refrigerant flowing pipe and the seed crystal is about the same as the seed crystal diameter. Thus, a temperature gradient in the vicinity of the seed crystal of only up to 200° C./cm may be achieved. As in the case according to the conventional method, the refrigerant flow rate necessary to attain a temperature gradient in the vicinity of the seed crystal of 400° C./cm require for five times the case of Example 1 and not practical. Also, as mentioned above, the refrigerant rate to flow through the cooling pipe is increased to provide precipitous temperature gradient in the vicinity of the seed crystal, then, the entire heat sink is cooled and the liquefied raw material is cooled down. As a result, growth rate on the solid-liquid interface is unable to control accurately and a compositional striation due to the variation of growth rate occurs.

According to Example 1, the cap 17 which is the cooling apparatus is mounted directly to achieve a temperature gradient of 400° C./cm or more in the soaking treatment. In addition, independence of the crucible support member and the cooling apparatus enable to control the misalignment in temperature without cooling the liquefied materials. Further, in the seeding process, only the temperature gradient in the vicinity of the seed crystal 14 is made to 50° C./cm and the other furnace temperature gradient is made to 5° C./cm while local temperature distribution may be controlled to an appropriate distribution for growing crystals in detail.

Example 2

In Example 2, KTa$_x$Nb$_{1-x}$O$_3$(0≤x≤1) crystal is produced by using an apparatus for producing crystals with the Vertical Bridgman Method according to Example 1. K(Ta, Nb)O$_3$ seed crystal 14 in direction of {100} is placed in a crucible 11 with a diameter of 2 inches. However, when the composition of K(Ta, Nb)O$_3$ seed crystal 14 is KTa$_{x'}$Nb$_{1-x'}$O$_3$, x' is larger than x of growing KTa$_x$Nb$_{1-x}$O$_3$ and composition with high liquefying temperature is selected. The raw material of KTa$_x$Nb$_{1-x}$O$_3$ is weighed to have natural raw material of K$_2$CO$_3$, Ta$_2$O$_5$, and Nb$_2$O$_5$ in a desired relative proportion and the total of 1 kg is filled in the crucible 11.

The temperature of K(Ta,Nb)O$_3$ seed crystal 14 and the crucible 11 filled with a raw material 12 are raised by the heating element 16 and made into a K(Ta, Nb)O$_3$ raw material solution 12 by heating and dissolving the raw material 12. The cap 17a and 17b which is the cooling apparatus as shown in FIG. 3A is mounted directly outside the portion of crucible 11 where the seed crystal 14 is placed, and placed on the crucible support member 19. Water as a refrigerant is flowed through the hollow portion of the cap 17a and 17b and regulate the flow to control axial temperature distribution in the vicinity of the seed crystal 14 locally.

Soaking treatment is given for ten hours at a temperature of 100° C. higher than the crystallization temperature of KTa$_x$Nb$_{1-x}$O$_3$. Water as a refrigerant is flowed through the cap 17 at this time. The flow rate is previously obtained experimentally and made to achieve a temperature gradient of 400° C./cm in the vicinity of the seed crystal 14. Since the cap 17 is divided vertically into two stages, the maximum temperature gradient achieved during soaking treatment may be raised from 400° C./cm to 600° C./cm.

Subsequently, the heat rate of the heating element 16 is lowered and an axial temperature distribution 15 as shown in FIG. 6 is realized. At the same time, amount of the water as a refrigerant flowing through the cap 17 is reduced to the amount that a temperature gradient 5° C./cm previously obtained experimentally to grow crystals is realizable on the solid-liquid interface in the vicinity of the seed crystal 14.

Figure 8:
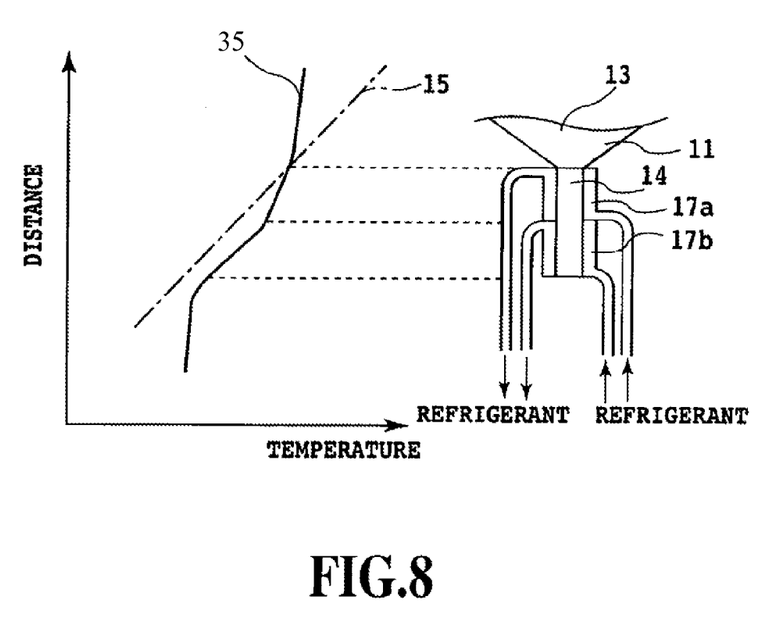
FIG. 8 is a view showing an example of the axial temperature distribution in the vicinity of the seed crystal according to Example 2 of the present invention.

In FIG. 8, an example of axial temperature distribution in the vicinity of the seed crystal is shown. Conventionally achieved axial temperature distribution is the axial temperature distribution 15. As shown in the axial temperature distribution 35, the portion where the seed crystal 14 is placed is locally cooled to make the temperature gradient in the vicinity of the seed crystal 14 to 50° C./cm at the lower portion, 25° C./cm at the upper portion, and the other furnace temperature gradient is made to 5° C./cm. As a result, the seeding process is performed under an optimal temperature condition for crystal growth on the solid-liquid interface by retaining only the temperature gradient of the lower portion of the seed crystal 14 the same as that of the conventional temperature distribution 15

Then, the crucible 11 is pulled down at a rate of 2 mm/day. K(Ta, Nb)O$_3$ raw material solution 12 is crystallized from lower portion of the crucible 11 by using K(Ta, Nb)O$_3$ seed crystal 14 as a nuclei and crystal 13 is grown. After the crystal growth, power of the heating element 16 is regulated to slowly cool down to room temperature.

When the produced K(Ta, Nb)O$_3$ crystal 13 is retrieved, four-fold {100}-faceted surface is expressed. There are no stray crystals generated from the crucible wall. Conventionally, seed crystals are dissolved by performing soaking treatment. According to Example 2, seed crystals are not dissolved. In addition, the temperature gradient of the seed crystal may be varied between upper portion and lower portion. Therefore, cracks of the seed crystal due to large temperature variation and transmission of cracks to grown crystals are reduced, although less frequently, and yield has been improved. Cracks and defects are not found in the grown crystal and highly-qualified crystals may be grown with good yield. Further, highly-qualified crystals may also be obtained with good yield in the case of using KTaO$_3$ seed crystal as a seed crystal.

Compared with the method using heat sink according to the Patent Document 3, as mentioned above, a temperature gradient in the vicinity of the seed crystal is conventionally about 200° C./cm while a temperature gradient of up to about 600° C./cm may be achieved by Example 2. In addition, refrigerant flow necessary to achieve the same temperature gradient of 400° C./cm is seven times that of the present invention. As in the case of the conventional method, the refrigerant flow necessary to achieve temperature gradient in the vicinity of the seed crystal of 600° C./cm is about seven times that of Example 2 and not practical.

Example 3

Figure 9:
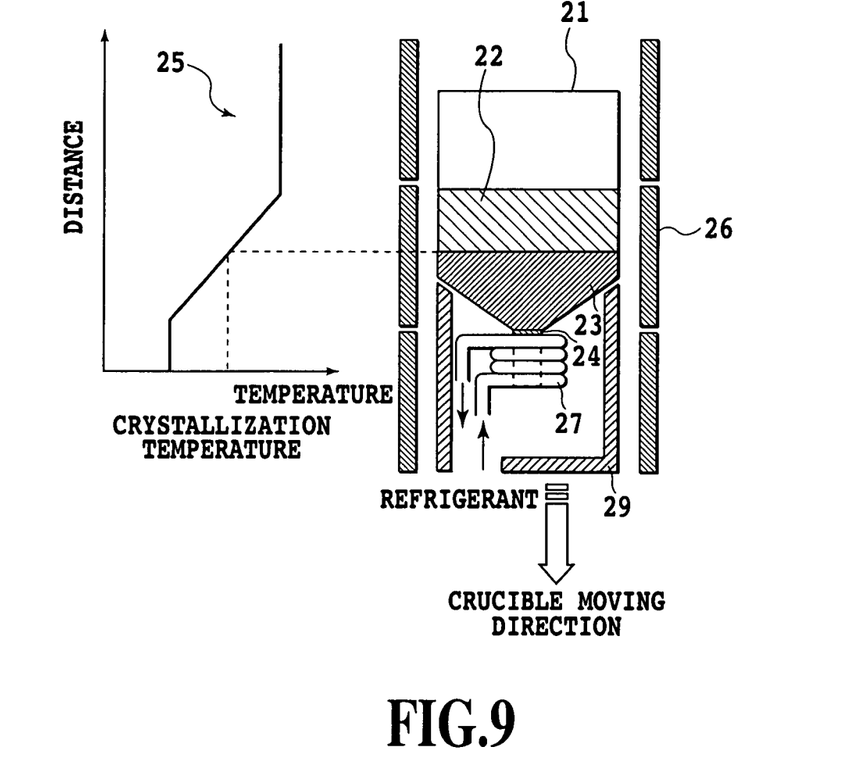
FIG. 9 is a view showing a configuration of an apparatus for producing crystals by the Vertical Bridgman Method according to Example 3 of the present invention.

In FIG. 9, a configuration of an apparatus for growing crystals by the Vertical Bridgman Method according to Example 3 of the present invention is shown. The case of producing $KTa_xNb_{1-x}O_3$ (0≤x≤1) crystals will be described. $K(Ta, Nb)O_3$ seed crystal 24 in direction of {100} is placed in a crucible 21 with a diameter of 2 inches. However, when the composition of $K(Ta, Nb)O_3$ seed crystal 24 is $KTa_{x'}Nb_{1-x'}O_3$, x' is larger than x of growing $KTa_xNb_{1-x}O_3$ and composition with high liquefying temperature is selected. The raw material of $KTa_xNb_{1-x}O_3$ is weighed to have natural raw material of $K_2CO_3$, $Ta_2O_5$, and $Nb_2O_5$ in a desired relative proportion and the total of 1 kg is filled in the crucible 21.

The temperature of the crucible 21 filled with $K(Ta, Nb)O_3$ seed crystal 24 and a raw material 22 are raised by the heating element 26 and made into a $K(Ta, Nb)O_3$ raw material solution 22 by heating and dissolving the raw material 22. The pipe 27 which is the cooling apparatus as shown in FIG. 2B is coiled directly outside the crucible where the seed crystal 14 is placed, and placed on the crucible support member 29. Water as a refrigerant is flowed through the pipe 27 and the flow and conducting heating amount are regulated to control axial temperature distribution in the vicinity of the seed crystal 24 locally.

Figure 10A:
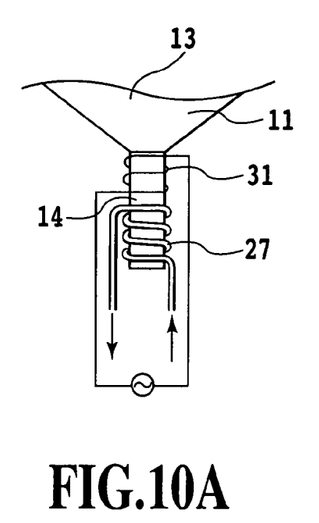
FIG. 10A is a view showing an example of a micro heater according to Example 3.
Figure 10B:
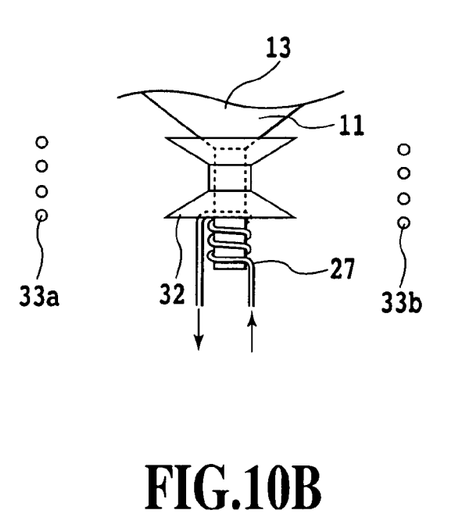
FIG. 10B is a view showing an example of a micro heater according to Example 3.

In FIG. 10, an example of a micro heater according to Example 3 is shown. The micro heater is necessary to be equipped with the following requirement. Requirement 1: The length of the heating area of the micro heater to be shorter than that of a seed crystal. Requirement 2: Preferably, the micro heater is placed near the top of the seed crystal and enabled to control a temperature gradient on the solid-liquid interface. Requirement 3: Reduce the volume of the micro heater and the heat capacity to obtain a rapid response to temperature control.

In Example 3, $KTa_xNb_{1-x}O_3$ (0≤x≤1) crystal is produced by using the micro heater with the following method.

Method A: As shown in FIG. 3B, Pt pipe 27 is divided vertically into two stages and a mechanism to apply a voltage is provided, i.e., the upper pipe 27a operate as a resistance heating method Pt heater.

Method B: Inner diameter is adjacent to the seed crystal and a coiled resistance heating method SiC heater 31 is provided as in the case of the pipe 27. (See FIG. 10A)

Method C: Inner diameter is adjacent to the seed crystal and a Pt resistance heating plate 32 having a sectional shape that can apply high-frequency efficiently, and a high-frequency heating method Pt heater having high-frequency generation coil 33a, 33b are provided. (See FIG. 10B).

Soaking treatment is given for twenty hours at a temperature of 50° C. higher than the crystallization temperature of $KTa_xNb_{1-x}O_3$. Water as a refrigerant is flowed through the pipe 27 at this time and not conducted to the micro heater. The amount of flow is previously obtained experimentally and made to achieve a temperature gradient of 250° C./cm in the vicinity of the seed crystal. Subsequently, the heating rate of the heating element 26 is regulated to achieve the axial temperature distribution 25 as shown in FIG. 9. At the same time, amount of the water as a refrigerant flowing through the pipe 27 is reduced to the amount that temperature gradient 3° C./cm previously obtained experimentally to grow crystals is realizable on the solid-liquid interface in the vicinity of the seed crystal 14. One of the micro heaters of Method A to C starts conducting heat concurrently at this time.

Refrigerant flow rate of the pipe 27 and conducting rate of the micro heater are regulated to achieve the axial temperature distribution shown in FIG. 8. Conventionally achieved axial temperature distribution is the axial temperature distribution 15. As shown in the axial temperature distribution 18, the portion where the seed crystal 14 is placed is locally cooled to make a temperature gradient in the vicinity of the seed crystal 14 to 40° C./cm at the lower portion, 20° C./cm at the upper portion, and the other furnace temperature gradient is made to 3° C./cm. As a result, seeding process is performed under an optimal temperature condition on the solid-liquid interface by retaining only the temperature gradient of the lower portion of the seed crystal 14 same as that of conventional temperature distribution 15.

Then, the crucible 21 is pulled down at a rate of 2 mm/day. $K(Ta, Nb)O_3$ raw material solution 22 is crystallized from lower portion of the crucible 21 by using $K(Ta, Nb)O_3$ seed crystal 24 as a nuclei and crystal 23 is grown. After the crystal growth, power of the heating element 26 is regulated to slowly cool down to the room temperature.

When the produced $K(Ta, Nb)O_3$ crystal 23 is retrieved, four-fold {100}-faceted surface is expressed. There are no stray crystals generated from the crucible wall. Conventionally, seed crystals are dissolved by performing soaking treatment. According to Example 3, seed crystals are not dissolved. In addition, a temperature gradient of the seed crystal may be varied between upper portion and lower portion. Therefore, cracks of the seed crystal due to large temperature variation and transmission of cracks to grown crystals are reduced, although less frequently, and yield has been improved. Cracks and defects are not found in the grown crystal and highly-qualified crystals may be grown with good yield. Further, in the case of using $KTaO_3$ seed crystal as a seed crystal, highly-qualified crystals may be also obtained with good yield.

With reference to FIGS. 6-10, the present embodiments have been shown for the cases applied to the Vertical Bridgman Method, but they can also be applied to the Vertical Gradient Freeze Method which is of basically same growing process, and to the Horizontal Bridgman Method as well as the horizontal gradient freeze method. Thus, the equivalent effects may be obtained by these methods.

The invention claimed is:

1. An apparatus for producing crystals wherein a seed crystal is placed in a crucible retained in a furnace, raw materials filled in the crucible are heated and liquefied, and a crystal is grown by slow cooling of the raw materials in the crucible from below upward, said apparatus comprising:
   a temperature controlling means including a hollow constructed cap mounted directly outside the portion of the crucible where the seed crystal is placed, the cap being separated from a crucible support member, wherein the temperature controlling means regulates refrigerant flow running through the hollow portion of the cap to control a temperature of the seed crystal;
   wherein the overall cross section of the cap outside the portion of the crucible where the seed crystal is placed decreases in size along an upward path direction of the refrigerant flow, and the temperature controlling means performs cooling or heating in the vicinity of the seed crystal locally.

2. The apparatus for producing the crystals according to claim 1, wherein:
   the cap is divided into multiple caps; and
   the temperature controlling means independently regulates refrigerant flow running through each hollow portion of the multiple caps.

3. The apparatus for producing the crystals according to claim 1, wherein the cap includes a heater and the temperature controlling means controls the heater along with the refrigerant flow to control the temperature of the seed crystal.

4. The apparatus for producing the crystals according to claim 1, wherein the material of the cap consists of one of a metal having conductive property, heat-resistant and corrosion-resistant of Pt or the equivalent, and an oxide having conductive property, heat-resistant and corrosion-resistant.

5. The apparatus for producing crystals according to claim 1, wherein the cap encircles the crucible.

6. An apparatus for producing crystals wherein a seed crystal is placed in a crucible retained in a furnace, raw materials filled in the crucible are heated and liquefied, and a crystal is grown by slow cooling of raw materials in the crucible from below upward, said apparatus comprising:
   a temperature controlling means including a helical pipe mounted directly outside the portion of the crucible where the seed crystal is placed, the pipe being separated from a crucible support member, wherein the temperature controlling means regulates refrigerant flow running through the pipe to control a temperature of the seed crystal;
   wherein the refrigerant flow moves upward through at least a portion of the pipe mounted directly outside the portion of the crucible where the seed crystal is placed and the cross section of the portion of the pipe through which the refrigerant flow moves upward decreases in size along the upward path direction of the refrigerant flow and the temperature controlling means performs cooling or heating in the vicinity of the seed crystal locally.

7. The apparatus for producing the crystals according to claim 6 wherein the temperature controlling means regulates the refrigerant flow by introducing refrigerant at a lower portion of the pipe and discharging refrigerant from an upper portion of the pipe.

8. The apparatus for producing the crystals according to claim 6 wherein:
   the pipe is divided into multiple pipes; and
   the temperature controlling means independently regulates refrigerant flow running through each of the multiple pipes.

9. The apparatus for producing the crystals according to claim 6, wherein the pipe includes a heater and the temperature controlling means controls the heater along with the refrigerant flow to control the temperature of the seed crystal.

10. The apparatus for producing the crystals according to claim 6, wherein the material of the pipe consist of one of a metal having conductive property, heat-resistant and corrosion-resistant of Pt or the equivalent, and an oxide having conductive property, heat-resistant and corrosion-resistant.

11. The apparatus for producing crystals according to claim 6, wherein the portion of the pipe through which the refrigerant flow moves upward abuts the crucible.

12. An apparatus for producing crystals by slow cooling of a raw material solution from below upward, the apparatus comprising:
   a crucible configured to receive a seed crystal and raw materials, the crucible having a lower portion in which the seed crystal is placed;
   a heating element configured to heat and liquefy the raw materials disposed within the crucible so as to form a raw material solution;
   a crucible support member on which the crucible rests; and
   temperature controlling means that perform local cooling and heating of the lower portion of the crucible, the temperature controlling means comprising:
      a refrigerant flow element positioned adjacent to the lower portion of the crucible, the refrigerant flow element configured to allow a refrigerant to flow upward therethrough, the refrigerant flow element being physically separated from the crucible support member, wherein an overall cross section of the refrigerant flow element adjacent to the lower portion of the crucible decreases in size along the upward path direction of the refrigerant flow.

13. The apparatus for producing crystals according to claim 12, wherein the refrigerant flow element comprises a hollow cap.

14. The apparatus for producing crystals according to claim 12, wherein:
   the refrigerant flow element comprises a plurality of hollow caps; and
   the temperature controlling means independently regulates refrigerant flow running through each hollow portion of the plurality of caps.

15. The apparatus for producing crystals according to claim 12, wherein the refrigerant flow element comprises a helical pipe.

16. The apparatus for producing crystals according to claim 15 wherein the helical pipe is configured to receive the refrigerant at a bottom portion thereof and discharge the refrigerant at an upper portion thereof.

17. The apparatus for producing crystals according to claim 12, wherein the refrigerant flow element includes a heater and the temperature controlling means controls the heater.

18. The apparatus for producing crystals according to claim 12, wherein the refrigerant flow element positioned adjacent to the lower portion of the crucible abuts the crucible and the cross section of the portion of the refrigerant flow element that abuts the crucible decreases in size along the upward path direction of the refrigerant flow.

* * * * *